United States Patent
Hong et al.

(10) Patent No.: US 9,905,333 B2
(45) Date of Patent: Feb. 27, 2018

(54) TRANSPARENT CONDUCTIVE FILM AND ELECTRONIC DEVICE INCLUDING THE SAME

(71) Applicants: SAMSUNG DISPLAY CO., LTD., Yongin-si, Gyeonggi-do (KR); Seoul National University R&DB Foundation, Seoul (KR)

(72) Inventors: Jong Ho Hong, Yongin-si (KR); Won Sang Park, Yongin-si (KR); Jae Ik Lim, Hwaseong-si (KR); Hye Yong Chu, Hwaseong-si (KR); Dae-Hyeong Kim, Incheon (KR); Donghee Son, Seoul (KR); Jun-Kyul Song, Seoul (KR)

(73) Assignees: SAMSUNG DISPLAY CO., LTD., Yongin-Si, Gyeonggi-Do (KR); SEOUL NATIONAL UNIVERSITY INDUSTRY—UNIVERSITY R & DB FOUNDATION, Seoul (KR)

( * ) Notice: Subject to any disclaimer, the term of this patent is extended or adjusted under 35 U.S.C. 154(b) by 0 days.

(21) Appl. No.: 15/468,176

(22) Filed: Mar. 24, 2017

(65) Prior Publication Data
US 2017/0309368 A1    Oct. 26, 2017

(30) Foreign Application Priority Data
Apr. 22, 2016    (KR) .................. 10-2016-0049339

(51) Int. Cl.
| | |
|---|---|
| H01L 47/00 | (2006.01) |
| H01B 5/14 | (2006.01) |
| H01L 51/50 | (2006.01) |
| H01L 51/52 | (2006.01) |
| H01B 1/02 | (2006.01) |

(Continued)

(52) U.S. Cl.
CPC ............ *H01B 5/14* (2013.01); *B32B 15/043* (2013.01); *B32B 15/092* (2013.01); *B32B 27/38* (2013.01); *H01B 1/02* (2013.01); *H01L 51/504* (2013.01); *H01L 51/5218* (2013.01); *H01L 51/5234* (2013.01); *B32B 2307/202* (2013.01); *B32B 2307/412* (2013.01); *B32B 2307/418* (2013.01);
(Continued)

(58) Field of Classification Search
CPC ............ H01L 51/5218; H01L 51/5234; H01L 51/504; B32B 5/14; B32B 15/043; B32B 15/092; B32B 27/38; H01B 1/02
USPC .......................................................... 257/4
See application file for complete search history.

(56) References Cited

U.S. PATENT DOCUMENTS

| | | | | |
|---|---|---|---|---|
| 7,534,500 B2* | 5/2009 | Kobayashi | ........ | B29C 45/14811 200/310 |
| 8,890,402 B2* | 11/2014 | Mori | .................. | H01L 51/5268 313/501 |
| 2015/0295195 A1 | 10/2015 | Pfeiffer et al. | | |

FOREIGN PATENT DOCUMENTS

| | | |
|---|---|---|
| JP | 07-042716 Y2 | 10/1995 |
| KR | 1988-0008059 A | 8/1988 |

(Continued)

OTHER PUBLICATIONS

Nature Materials, 9, 821, 2010.
(Continued)

*Primary Examiner* — Luan C Thai
(74) *Attorney, Agent, or Firm* — Lee & Morse, P.C.

(57) ABSTRACT

A transparent conductive film includes a metal oxide, a metal, and an epoxy, wherein a refractive index of the metal may be lower than that of the epoxy.

21 Claims, 12 Drawing Sheets

(51) Int. Cl.
  *B32B 15/04* (2006.01)
  *B32B 15/092* (2006.01)
  *B32B 27/38* (2006.01)

(52) U.S. Cl.
  CPC ... *B32B 2309/105* (2013.01); *H01L 2251/301* (2013.01); *H01L 2251/308* (2013.01)

(56) References Cited

FOREIGN PATENT DOCUMENTS

| | | |
|---|---|---|
| KR | 10-1075447 B1 | 10/2011 |
| KR | 10-1489161 B1 | 1/2015 |

OTHER PUBLICATIONS

Nano Letters, 13 2814, 2013—High-Performance, Transparent, and Stretchable Electrodes Using Graphene—Metal Nanowire Hybrid Structures.
Advanced Materials, 26, 3618, 2014—Interfacial Engineering of Ultrathin Metal Film Transparent Electrode for Flexible Organic Photovoltaic Cells.
Nature Communications, 5, 3005, 2014—Ultra-high mobility transparent organic thin film transistors grown by an off-centre spin-coating method.
Advanced Healthcare Materials, 2015, DOI: 10.1002/adhm.201500097.
Nature Communications, 6 6503, 2015.

\* cited by examiner

No deformation (b)

Curvature radius = 1.3 cm (c)

Curvature radius = 0.52 cm (d)

Curvature radius = 0.38 cm

TRANSPARENT CONDUCTIVE FILM AND ELECTRONIC DEVICE INCLUDING THE SAME

CROSS-REFERENCE TO RELATED APPLICATION

Korean Patent Application No. 10-2016-0049339, filed on Apr. 22, 2016, in the Korean Intellectual Property Office, and entitled: "Transparent Conductive Film and Electronic Device Including the Same," is incorporated by reference herein in its entirety.

BACKGROUND

1. Field

The present disclosure relates to a transparent conductive film and an electronic device including the same, and more particularly, to a flexible transparent conductive film and an electronic device including the same.

2. Description of the Related Art

In general, an indium tin oxide (ITO) film (in which tin is doped to indium oxide) has been widely utilized as a transparent conductive film used for an electrode material of a display device (such as a liquid crystal display or an organic light emitting diode display), or an opto-electronic element (such as a solar cell). The ITO film has excellent transparency, conductivity, and adhesion to a substrate, and an etching process may be applied thereto. However, since the ITO film may be easily broken, it may not be easily applied to stretchable or bendable electronic devices.

The above information disclosed in this Background section is only for enhancement of understanding and therefore it may contain information that does not form the prior art that is already known in this country to a person of ordinary skill in the art.

SUMMARY

An exemplary embodiment of the present disclosure provides a transparent conductive film including a metal oxide, a metal, and an epoxy, wherein a refractive index of the metal is lower than that of the epoxy.

The transparent conductive film may further include a first layer including the metal oxide, a second layer that is positioned on the first layer and includes the metal, and a third layer that is positioned on the second layer and includes the epoxy.

The second layer may contact the third layer.

The third layer may have insulation characteristics.

The first layer, the second layer, and the third layer may respectively include lateral walls that are arranged to be parallel to each other.

A thickness of the first layer may be equal to or less than about 50 nm.

A thickness of the second layer may be about 3 nm to about 10 nm.

The metal may include at least one of copper, silver, gold, aluminum, nickel, molybdenum, chromium, tantalum, and titanium.

The metal oxide may include an ITO or an IZO.

A resistance value of the transparent conductive film may be equal to or less than about 50 Ω/sq.

Another embodiment of the present disclosure provides an electronic device including: a first electrode; a second electrode overlapped with the first electrode; and an emission layer positioned between the first electrode and the second electrode, wherein at least one of the first electrode and the second electrode includes a transparent conductive film, the transparent conductive film includes a metal oxide, a metal, and an epoxy, and a refractive index of the metal is lower than that of the epoxy.

The first electrode may be a reflecting electrode, and the second electrode may include the transparent conductive film.

The emission layer may be formed by a combination of a plurality of emission layers to emit white light.

The electronic device may further include a charge generation layer positioned between the plurality of emission layers.

The transparent conductive film may include a first layer including the metal oxide, a second layer that is positioned on the first layer and includes the metal, and a third layer that is positioned on the second layer and includes the epoxy.

The second layer may contact the third layer.

The third layer may have insulation characteristics.

The first layer, the second layer, and the third layer may respectively include lateral walls that are arranged to be parallel to each other.

The metal may include at least one of copper, silver, gold, aluminum, nickel, molybdenum, chromium, tantalum, and titanium.

The metal oxide may include an ITO or an IZO.

According to the embodiment of the present disclosure, it is possible to realize an electronic device that may improve flexibility thereof while maintaining high conductivity and transparency by forming a transparent conductive film including epoxy.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thickness of layers, films, panels, regions, etc., are exaggerated for clarity. In the drawings, for ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Figure 1:
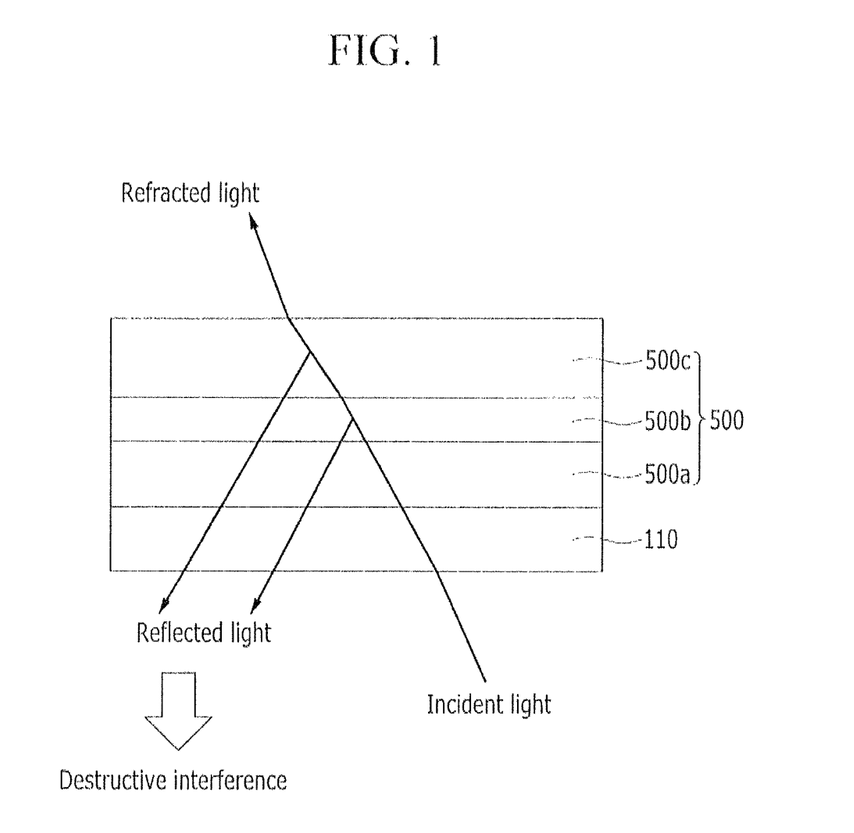
FIG. 1 illustrates a cross-sectional view of a state in which a transparent conductive film according to an exemplary embodiment of the present disclosure is disposed on a substrate.

FIG. 1 illustrates a cross-sectional view of a state in which a transparent conductive film according to an exemplary embodiment of the present disclosure is disposed on a substrate. Referring to FIG. 1, a transparent conductive film 500 is positioned on a substrate 110. The substrate 110 may be a glass substrate that is not processed.

The substrate 110 is one that is used for explaining a target for depositing the transparent conductive film 500, but it is not limited to the term "substrate", and it may be replaced by various targets on which the transparent conductive film included in an electronic device may be deposited. The target may be formed to have various shapes, e.g., may have a circular disk shape such as a wafer.

When the transparent conductive film 500 is used in a flexible device, the substrate 110 may include a polymer material such as polycarbonate, poly(methyl methacrylate), polyethylene terephthalate, polyethylene naphthalate, polyamide, polyimide, polyether sulfone, or combinations thereof.

The transparent conductive film 500 according to the exemplary embodiment of the present disclosure includes a metal oxide, a metal, and an epoxy, and a refractive index of the metal is lower than that of the epoxy. The epoxy may have a refractive index of about 1.6 in a visible wavelength band. The epoxy described in the exemplary embodiment of the present disclosure refers to a polymer compound including two or more epoxy groups in a molecule and a synthetic resin produced by a ring-opening reaction of the epoxy group. For example, the epoxy may be a line-shaped condensate of bisphenol A and epichlorohydrin. Moreover, the epoxy may be bisphenol A novolac epoxy.

As shown in FIG. 1, the transparent conductive film 500 includes a first layer 500a including the metal oxide, a second layer 500b on, e.g., directly on, the first layer 500a and including the metal, and a third layer 500c on, e.g., directly on, the second layer 500b and including the epoxy.

The first layer 500a may have a thickness equal to or less than about 50 nanometer (nm). The second layer 500b may have a thickness of about 3 nm to about 40 nm and the third layer 500c may have a thickness of about 60 nm to about 100 nm. Alternatively, the second layer 500b may have a thickness of about 6 nm to about 14 nm and the third layer 500c may have a thickness of about 70 nm to about 90 nm.

Since a metal oxide, e.g., an indium tin oxide (ITO) in the first layer 500a may have a low flexibility, the thickness of the first layer 500a, e.g., along a z-axis, may be equal to or less than about 50 nm for improving flexibility of the transparent conductive film 500. When the thickness of the first layer 500a is equal to or less than about 50 nm, the conductivity of the transparent conductive film decreases. However, when the second layer 500b including a metal, e.g., a low-cost copper, has a thickness of about 3 nm to about 40 nm, e.g., about 6 nm to about 14 nm, the conductivity of the transparent conductive film may be improved.

While this second layer 500b may decrease the transparency of the transparent conductive film, the third layer 500c including the transparent epoxy having a thickness about 60 nm to about 100 nm, e.g., about 70 nm to about 90 nm, may be used to improve the transparency of the transparent conductive film. While increasing the thickness of the third layer 500c including the epoxy may increase the transparency, as the thickness of a layer including the epoxy is increased, e.g., is equal to or greater than about 1000 nm, since ripple effects frequently occur after spin coating, variation effects may occur in each wavelength while measuring the transmittance.

The metal oxide included in the first layer 500a according to the exemplary embodiment of the present disclosure may be ITO or an indium zinc oxide (IZO). The metal included in the second layer 500b may include at least one of copper, silver, gold, aluminum, nickel, molybdenum, chromium, tantalum, and titanium. A refractive index of the metal may be lower than that of the epoxy included in the third layer 500c, and various metal materials that have a lower refractive index than the epoxy may be utilized other than the metals listed above.

Light incident on the transparent conductive film 500 from a lower portion of the substrate 110 is respectively reflected on the second layer 500b and the third layer 500c to generate reflected light. The respective reflected light generated on the second layer 500b and the third layer 500c cause destructive interference due to a refractive index difference between the second layer 500b and the third layer 500c, thereby improving the transmittance of the transparent conductive film 500. The destructive interference may be generated by optimizing thicknesses of respective layers of the transparent conductive film 500.

For an electrode or conductive film to be transparent, transmittance of the electrode or conductive film is to be equal to or greater than about 75%, e.g., about 85%. The transmittance may be referred to as transmittance over a visible light region.

Figure 2:
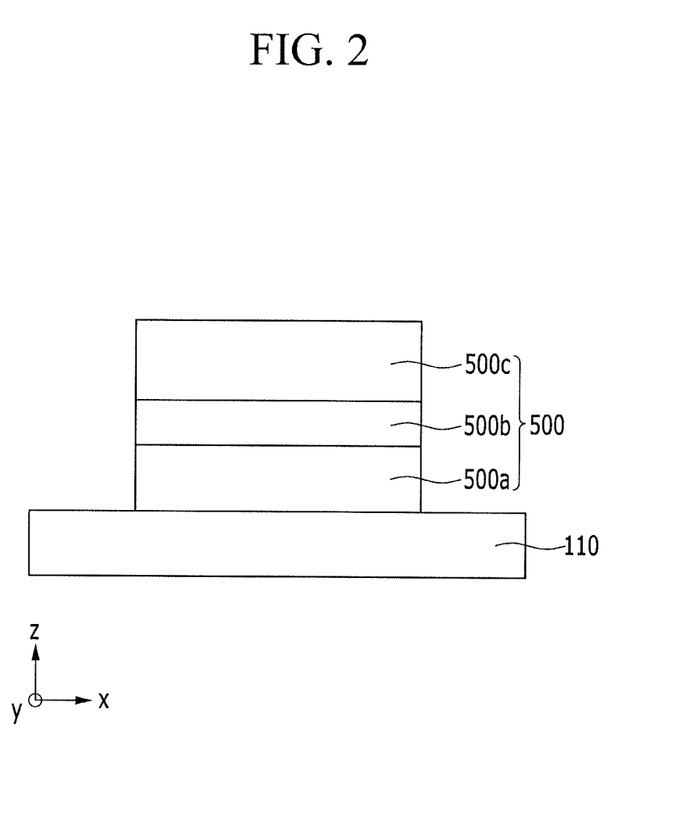
FIG. 2 illustrates a cross-sectional view of a portion at which the transparent conductive film of FIG. 1 is patterned.

FIG. 2 illustrates a cross-sectional view of a portion at which the transparent conductive film of FIG. 1 is patterned. Referring to FIG. 2, the first layer 500a, the second layer 500b, and the third layer 500c respectively include lateral walls that are arranged to be parallel to each other, e.g., along the z-axis. The first layer 500a, the second layer 500b, and the third layer 500c may be simultaneously patterned to form one transparent conductive film 500, thus the patterned shapes thereof are the same, e.g., have the same dimensions along the x and y axes while be stacked along the z-axis.

The transparent conductive film 500 according to the exemplary embodiment of the present disclosure may be patterned by a photo-process generally used in a semiconductor process. The patterned transparent conductive film 500 may have further high transmittance. When the transparent conductive film 500 is patterned, since a width of the film itself narrows, there is a tendency for the transmittance to be relatively high.

Figure 3:
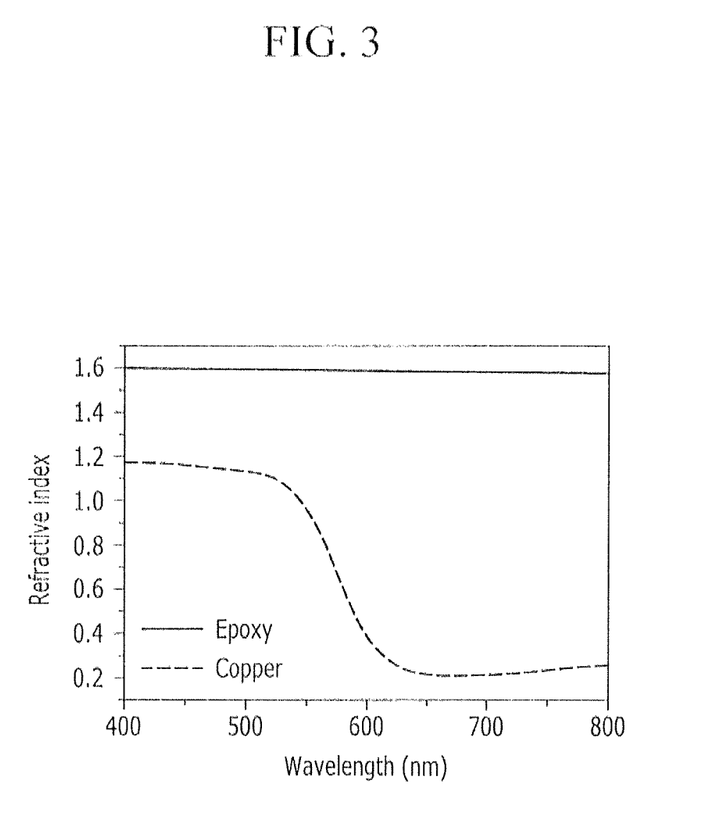
FIG. 3 illustrates a graph of a relationship between refractive indexes of copper and epoxy according to wavelengths.

FIG. 3 is a graph illustrating a relationship between refractive indexes of copper and epoxy according to wavelengths. Referring to FIG. 3, the refractive index of the epoxy is about 1.6 in most of the visible wavelength band and the refractive index of the copper varies with wavelength. The refractive index of the copper is relatively high in a low wavelength band of about 400 nm to about 550 nm and is relatively low in a high wavelength band of about 600 nm to about 800 nm, but is lower than that of the epoxy throughout the visible wavelength band.

Figure 4:
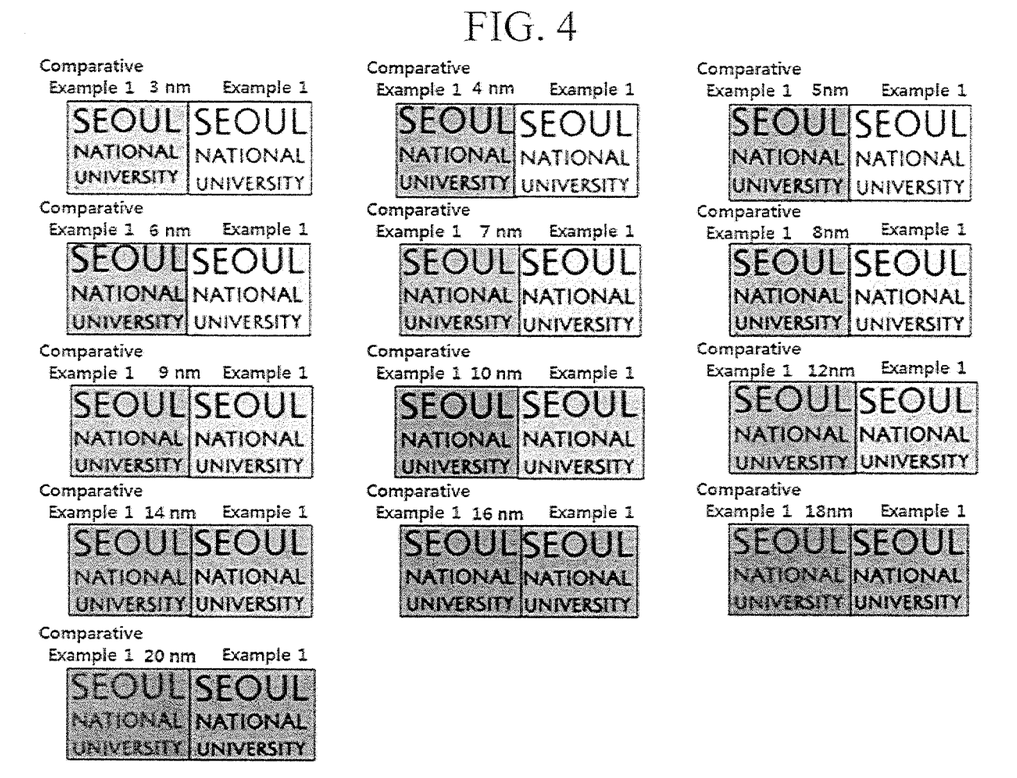
FIG. 4 illustrates a drawing comparing transparency of Comparative Example 1 with transparency of Example 1.

FIG. 4 is a drawing comparing transparency of Comparative Example 1 with transparency of Example 1. Comparative Example 1 is an ITO film having a thickness of about 50 nm on an unprocessed glass substrate and a copper film on the ITO film. Example 1 is an ITO film having a thickness of about 50 nm on an unprocessed glass substrate, a copper film on the ITO film, and an epoxy film having a thickness of about 80 nm on the copper film. FIG. 4 illustrates transparency measured while changing the thickness of the copper film to 3 nm, 4 nm, 5 nm, 6 nm, 7 nm, 8 nm, 9 nm, 10 nm, 12 nm, 14 nm, 16 nm, 18 nm, and 20 nm.

As can be seen in FIG. 4, Example 1, in which the epoxy film is covered on a conductive film of Comparative Example 1, has an increased transparency compared to Comparative Example 1. Further, as can be seen therein, the transparency decreases as the thickness of the copper film increases.

Figure 5:
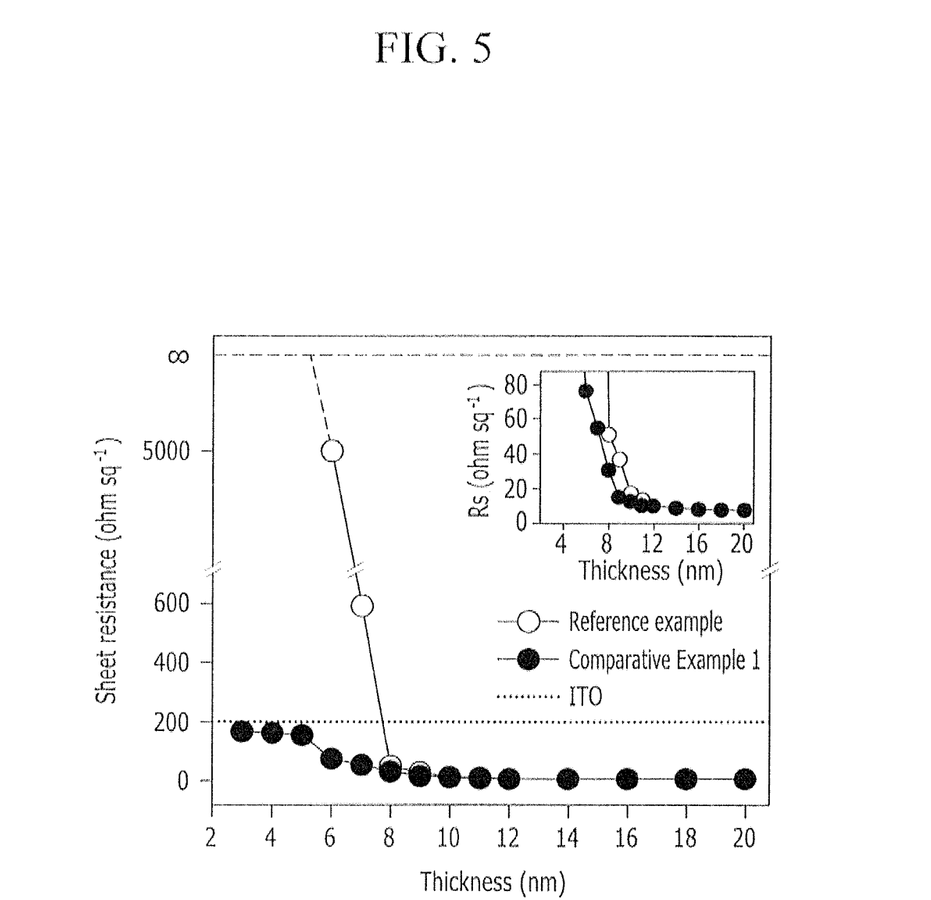
FIG. 5 illustrates a graph of sheet resistance according to thickness of a copper film in the cases that the copper film is formed on a glass substrate and that an ITO film and the copper film are formed on the glass substrate.

FIG. 5 illustrates a graph of sheet resistance according to thickness of a copper film in each of a reference example in which the copper film is formed on a glass substrate and Comparative Example 1 in which an ITO film and the copper film are sequentially formed on the glass substrate. In this case, when the ITO film has a thickness of about 50 nm, the sheet resistance thereof is about 200 Ω/sq.

Referring to FIG. 5, in the reference example, since a film is not well formed at a thickness that is equal to or less than about 8 nm, its sheet resistance is very high. In the case of Comparative Example 1, compared to an ITO film of a thickness of about 120 nm that is commercially available, sheet resistance of the ITO film having a thickness of about 50 nm and a copper film having a thickness of about 6 nm to about 8 nm on an ITO film is equal to or less than about 100 Ω/sq. When the thickness of the copper film is equal to or greater than about 7 nm in Comparative Example 1, the sheet resistance thereof is about 50 Ω/sq.

Figure 6:
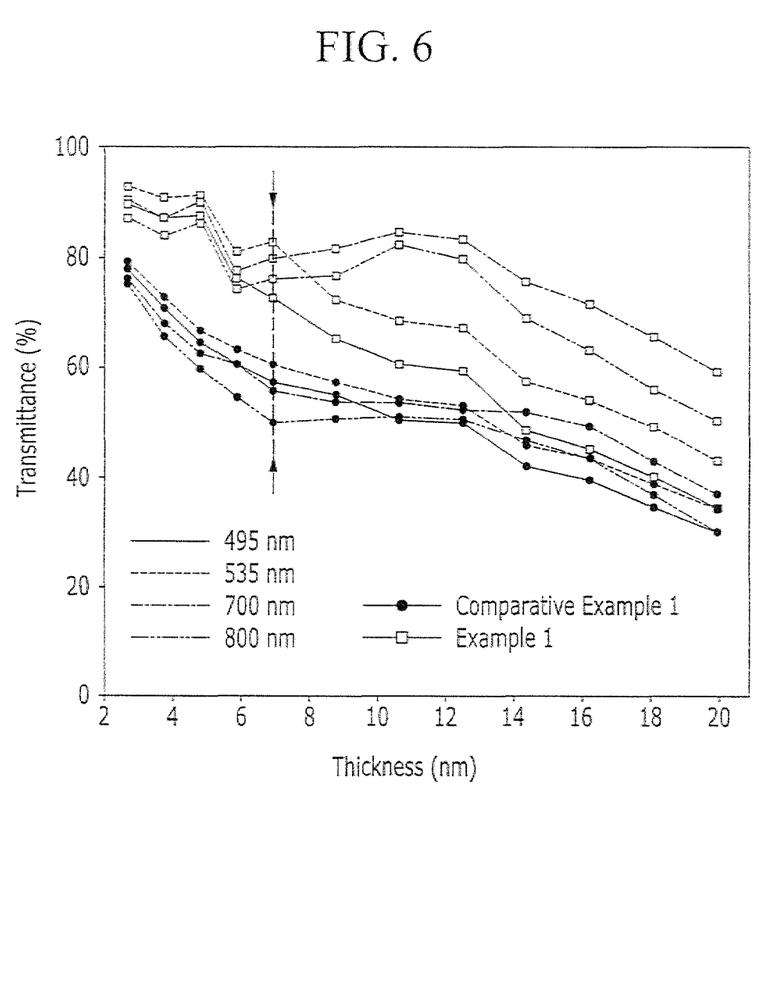
FIG. 6 illustrates a graph comparing transmittance of Comparative Example 1 with transmittance of Example 1.

FIG. 6 illustrates a graph comparing transmittance of Comparative Example 1 with transmittance of Example 1. As described above, Comparative Example 1 includes the ITO film on an unprocessed glass substrate and the copper film on the ITO film, and Example 1 includes the ITO film on an unprocessed glass substrate, the copper film on the ITO film, and the epoxy film on the copper film.

Referring to FIG. 6, as the thickness of the copper film increases, each transmittance of Comparative Example 1 and Example 1 substantially decreases. Compared to Comparative Example 1, transmittance in Example 1 is high, and when the thickness of the copper film is about 7 nm and the wavelength band of the transmittance is equal to or greater than about 700 nm which is close to an infrared wavelength band, the transmittance of Example 1 is equal to or greater than about 80%.

Figure 7:
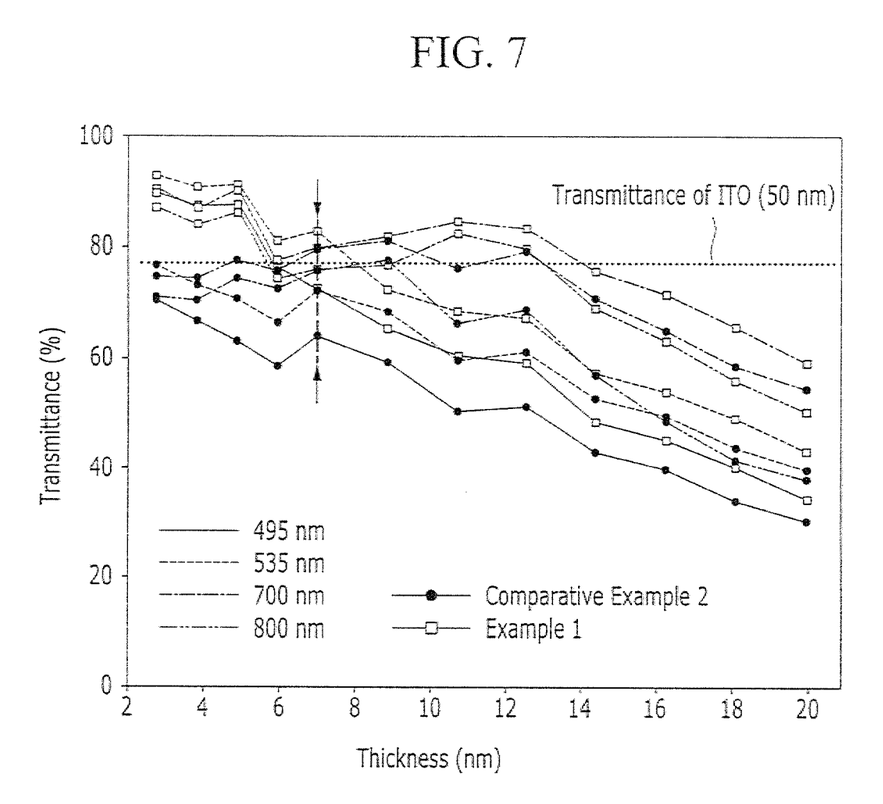
FIG. 7 illustrates a graph comparing transmittance of Comparative Example 2 with transmittance of Example 1.

FIG. 7 illustrates a graph comparing transmittance of Comparative Example 2 with transmittance of Example 1. Comparative Example 2 includes an ITO film on an unprocessed glass substrate, a copper film on the ITO film, and an ITO film on the copper film. Example 1 (as described above) includes an ITO film on an unprocessed glass substrate, a copper film on the ITO film, and an epoxy film on the copper film.

Referring to FIG. 7, as the thickness of the copper film increases, transmittances of Comparative Example 2 and Example 1 substantially decreases, but the transmittance of Example 1 is high compared to that of Comparative Example 2. Although Comparative Example 2 has a similar structure to an ITO/Ag/ITO structure as an electrode structure used in the prior art for improving transparency and resistance, the transparency of Example 1 is greater than Comparative Example 2 across the visible wavelength band. As shown in FIG. 7, when the ITO film is about 50 nm, the transmittance thereof is about 80%, and a similar transmittance thereto is measured in Example 1 of a wavelength of about 700 nm.

Figure 8:
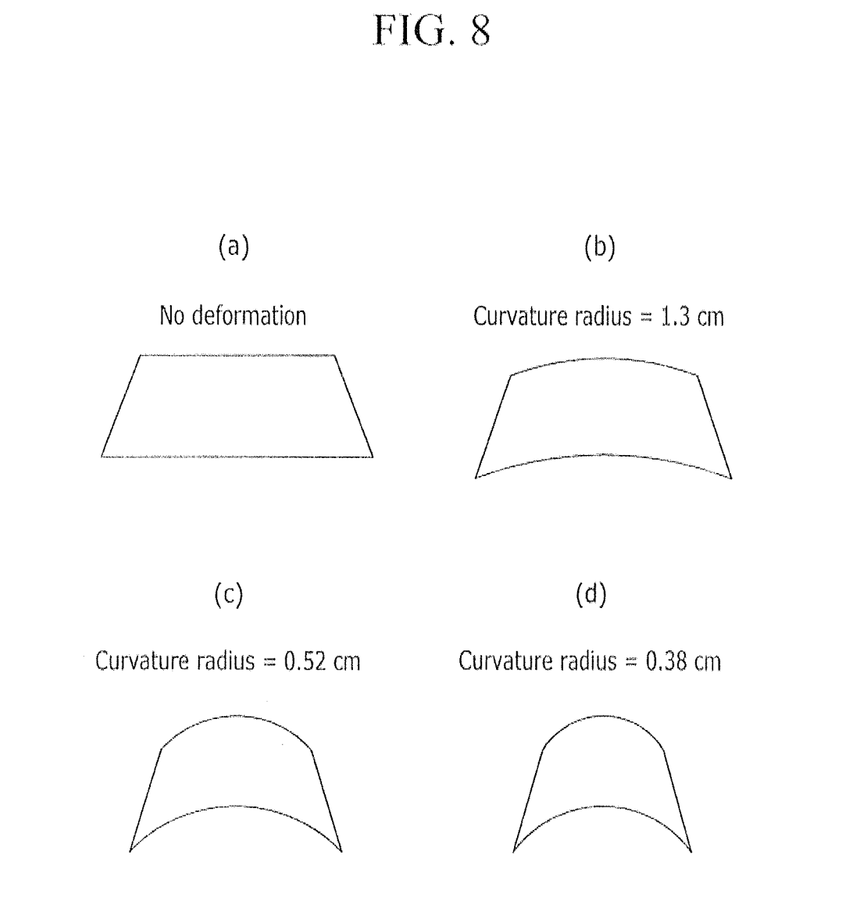
FIG. 8 illustrates shapes in which a transparent conductive film is bent according to changes of a curvature radius.
Figure 9:
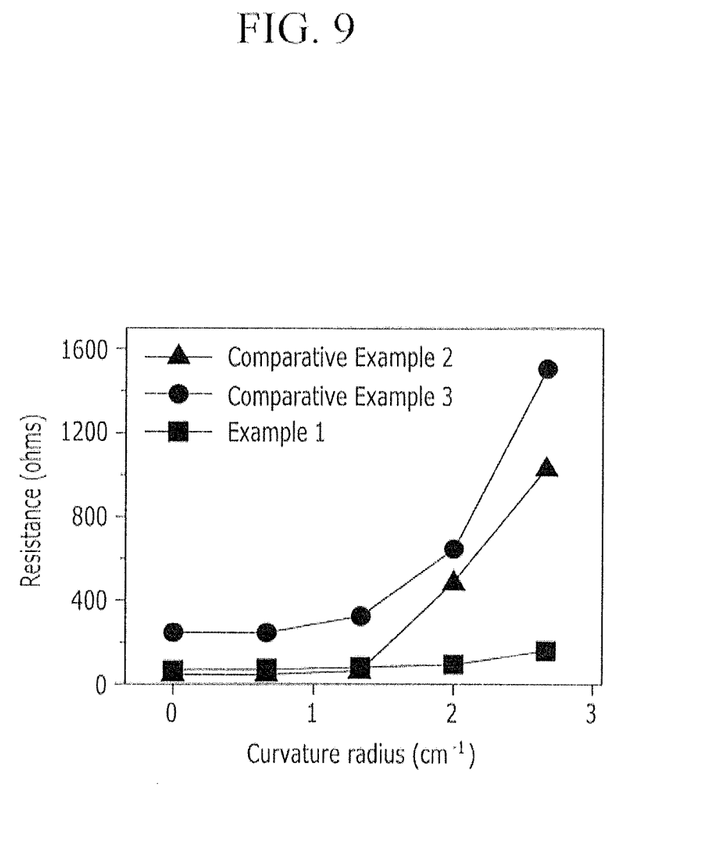
FIG. 9 illustrates a graph of resistance changes according to radiuses at which a transparent conductive film is bent in Comparative Example 2, Comparative Example 3, and Example 1.

FIG. 8 illustrates shapes in which a transparent conductive film is bent according to changes of a curvature radius. FIG. 9 illustrates a graph of resistance changes according to radiuses at which a transparent conductive film is bent in Comparative Example 2, Comparative Example 3, and Example 1.

In FIG. 9, Comparative Example 2 (as described above) includes an ITO film is on an unprocessed glass substrate, a copper film on the ITO film, and an ITO film on the copper film; Comparative Example 3 includes an ITO film on an unprocessed glass substrate, and Example 1 (as described above) includes an ITO film on an unprocessed glass substrate, a copper film on the ITO film, and an epoxy film on the copper film.

FIG. 8 schematically illustrates shapes of the transparent conductive film bent according to curvature radiuses, and as a reciprocal of the curvature radiuses shown in FIG. 8 increases, a deformation degree increases.

Referring to FIG. 9, as the reciprocal of the curvature radiuses increases, resistance tends to increase, because the deformation degree increases as the transparent conductive film is bent. Thus, the resistance thereof is changed. Even when the deformation degree is small, the resistance of Example 1 is small compared to that of Comparative Example 3, and when the reciprocal of the curvature radius is equal to or greater than about 1.2 cm$^{-1}$, the resistance of Example 1 is the smallest compared to that of Comparative Example 2 as well as that of Comparative Example 3.

Figure 10:
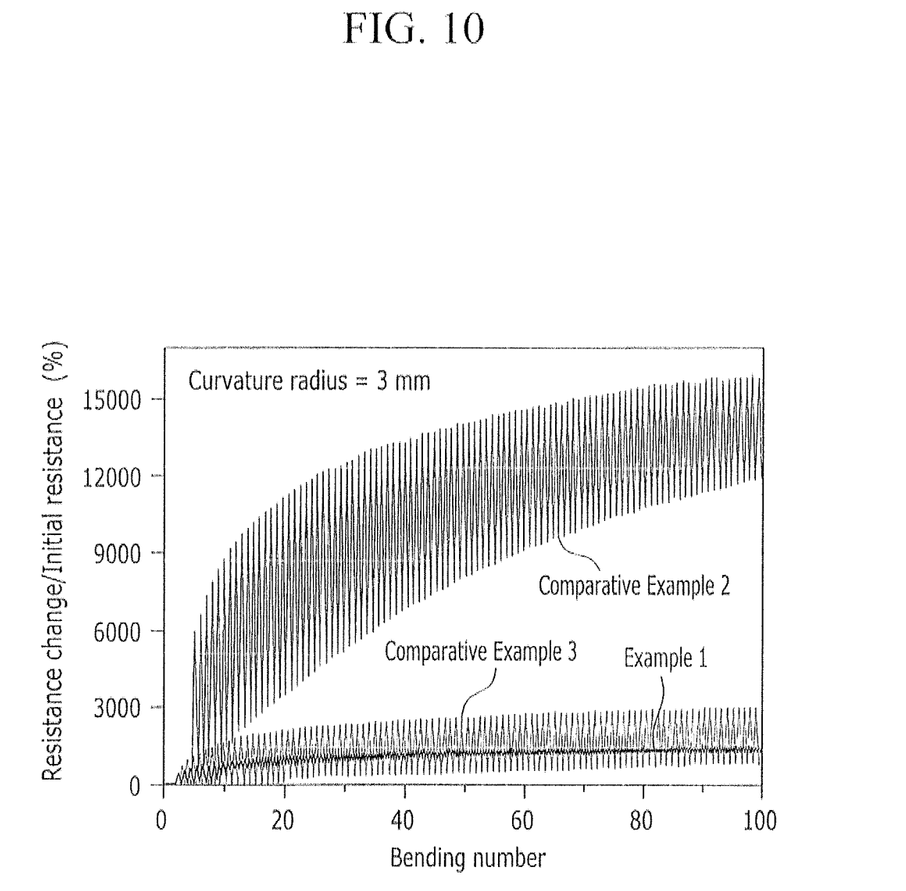
FIG. 10 illustrates a graph of resistance changes according to the number of bending a transparent conductive film in Comparative Example 2, Comparative Example 3, and Example 1.

FIG. 10 illustrates a graph of resistance changes according to the number of bends of a transparent conductive film in Comparative Example 2, Comparative Example 3, and Example 1.

Referring to FIG. 10, compared to those of Comparative Example 2 and Comparative Example 3, resistance change of Example 1 is the smallest while the transparent conductive film is bent 100 times, thus mechanical flexibility of Example 1 is the best.

Hereinafter, an organic light emitting device formed with the transparent conductive film described above will be described with reference to FIG. 11. The organic light emitting device is an example of electronic devices, and the aforementioned transparent conductive film may be utilized in a light-emitting device using quantum dots, a solar cell, etc. in addition to the organic light emitting device as an electrode, a wire, and the like.

Figure 11:
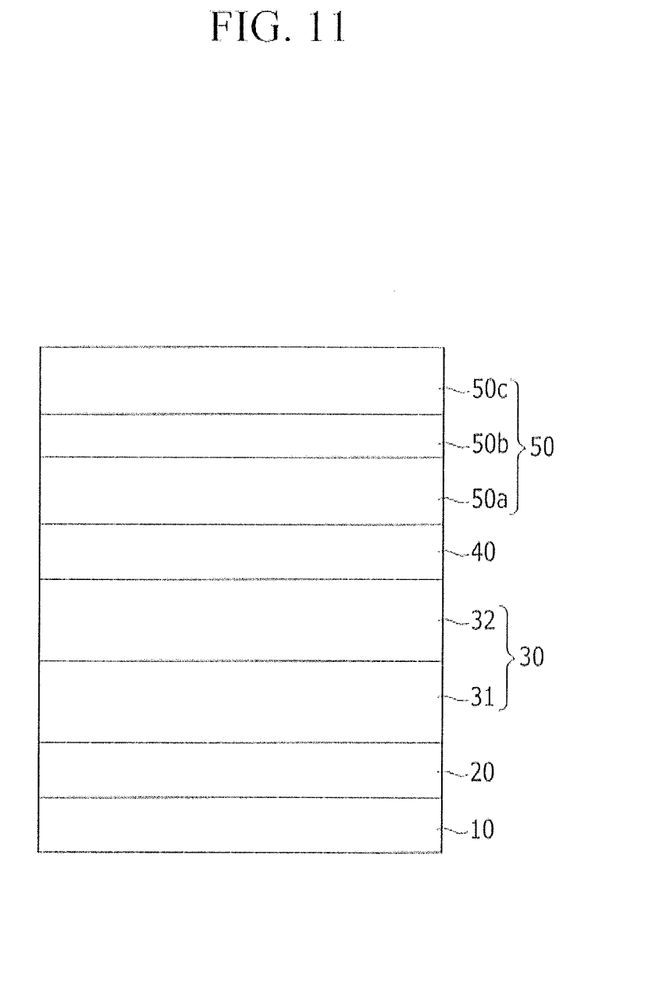
FIG. 11 illustrates a cross-sectional view of an organic light emitting device according to an exemplary embodiment of the present disclosure.
Figure 12:
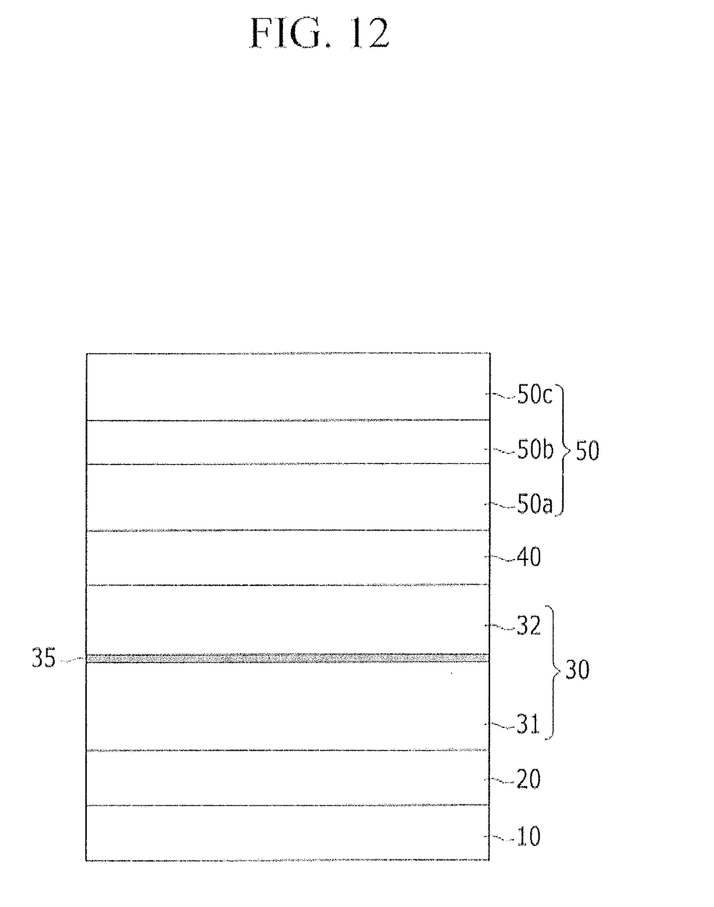
FIG. 12 illustrates a cross-sectional view of an exemplary embodiment in which a charge generation layer is added to the exemplary embodiment of FIG. 11.

FIG. 11 illustrates a cross-sectional view of an organic light emitting device according to an exemplary embodiment of the present disclosure. FIG. 12 illustrates a cross-sectional view of an exemplary embodiment in which a charge generation layer is added to the exemplary embodiment of FIG. 11.

Referring to FIG. 11, an organic light emitting device according to the exemplary embodiment of the present disclosure includes a first electrode 10, a hole transporting region 20 on the first electrode 10, an emission layer 30 on the hole transporting region 20, an electron transporting region 40 on the emission layer 30, and a second electrode 50 on the electron transporting region 40.

In the present exemplary embodiment, the first electrode 10 may be a reflecting electrode. In the present exemplary embodiment, the reflecting electrode may be defined as an electrode including a light-reflective material for reflecting light generated from the emission layer 30 to the second electrode 50. The first electrode 10 may include silver (Ag), aluminum (Al), chromium (Cr), molybdenum (Mo), tungsten (W), titanium (Ti), gold (Au), palladium (Pd), or an alloy layer thereof, and may be formed as a triple layer such as silver (Ag)/indium tin oxide (ITO)/silver (Ag), indium tin oxide (ITO)/silver (Ag)/indium tin oxide (ITO), or the like.

The first electrode 10 may be formed by using a sputtering method, a vapor phase deposition method, an ion beam deposition method, or an electron beam deposition method.

The hole transporting region 20 may include an auxiliary layer between the first electrode 10 and the emission layer 30. The hole transporting region may include at least one of a hole transporting layer and a hole injection layer. The hole transporting layer may serve to smoothly transport holes transmitted from the first electrode 10. The hole transport layer may include an organic material.

The emission layer 30 may include blue, red, or green emission materials, and the emission layer 30 may include a host and a dopant. The material forming the emission layer 30 is not limited to the above.

As shown in FIG. 11, the emission layer 30 may include two layers 31 and 32 that emit different colors. This may be a tandem type of white organic light emitting device, and the two layers emitting different colors may be mixed to emit white. For example, one of the two layers 31 and 32 may be a blue emission layer, and the other thereof may be a yellow emission layer. Alternatively, the emission layer 30 may be formed with three layers, and the three layers may respectively emit red, green, and blue, or blue, yellow, and blue.

By changing the exemplary embodiment of FIG. 11, as shown in FIG. 12, a charge generation layer 35 may be positioned between the two layers 31 and 32. The charge generation layer 35 is generally formed between adjacent emission layers to serve to adjust a charge balance between the adjacent emission layers.

The combinations of the plurality of emission layers 30 illustrated in FIG. 11 are merely examples, and the structure of the plurality of emission layers may be varied to realize white light by combination of the emission layers emitting colors that are different from each other.

The emission layer 30 illustrated in FIG. 11 and FIG. 12 is structurally formed by stacking a plurality of layers, but the emission layer 30 may be formed by respectively depositing red, green, and blue emission layers in a sub-pixel unit, as an example. The red, green, and blue emission layers may be horizontally disposed on an upper surface of the first electrode 10 to be parallel to each other.

Referring back to FIG. 11, the electron transporting region 40 may be on the emission layer 30. The electron transporting region 40 may include an auxiliary layer between the emission layer 30 and the second electrode 50. The electron transporting region 40 may include at least one of an electron transporting layer and an electron injection layer.

In the present exemplary embodiment, the second electrode 50 may be a transparent electrode for realizing a front type of organic light emitting device. In the present specification, the transparent electrode may be defined as an electrode that mostly passes light generated from the emission layer 30 or light generated from the emission layer 30 that is reflected from the first electrode 10 as a reflecting electrode to reach a user.

The second electrode 50 according to the present exemplary embodiment may be the transparent conductive film illustrated in FIG. 1 and FIG. 2. In other words, the second electrode 50 includes a first layer 50a including a metal oxide, a second layer 50b on the first layer 50a and includes a metal, and a third layer 50c on the second layer 50b and includes an epoxy. The aforementioned description for the transparent conductive film of FIG. 1 and FIG. 2 may be wholly applied to the present exemplary embodiment.

In the present exemplary embodiment, the transmittance of the second electrode 50 in the visible light region may be equal to or greater than about 75%, e.g., about 85%, and the conductivity thereof may be equal to or less than about 50 Ω/sq.

In the present exemplary embodiment, although it is described that the first electrode 10 is a reflecting electrode and the second electrode 50 is a transparent electrode, the first electrode 10 may be a transparent electrode and the second electrode 50 may be a reflecting electrode. Alternatively, both of the first electrode 10 and the second electrode 50 may be a transparent electrode, and in this case, both the first electrode 10 and the second electrode 50 may use the transparent conductive film illustrated in FIG. 1 and FIG. 2.

The transparent conductive film described above may be applied to wearable electronic devices or stretchable electronic devices in addition to the organic light emitting device, and it may be advantageously used in touch panels and display panels in which flexibility or stretching is required.

In the specification, the wearable electronic devices mean those that maximize portability and convenience of electronic products by adding a function of a smartphone or a computer to watches, glasses, accessories, clothes, etc.

By way of summation and review, one or more embodiments of the present disclosure is directed toward a transparent conductive film and an electronic device including the same that may improve flexibility thereof while maintaining high conductivity and transparency. Another aspect according to one or more embodiments of the present disclosure is directed toward an electronic device that uses a transparent conductive film to which a patterning process may be applied.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A transparent conductive film, comprising:
a metal oxide, a metal, and an epoxy,
wherein a refractive index of the metal is lower than that of the epoxy.

2. The transparent conductive film as claimed in claim 1, wherein:
a first layer includes the metal oxide,
a second layer on the first layer includes the metal, and
a third layer on the second layer includes the epoxy.

3. The transparent conductive film as claimed in claim 2, wherein the second layer contacts the third layer.

4. The transparent conductive film as claimed in claim 2, wherein the third layer has insulation characteristics.

5. The transparent conductive film as claimed in claim 2, wherein the first layer, the second layer, and the third layer respectively include lateral walls that are parallel to each other.

6. The transparent conductive film as claimed in claim 2, wherein a thickness of the first layer is equal to or less than about 50 nm.

7. The transparent conductive film as claimed in claim 6, wherein a thickness of the second layer is about 3 nm to about 10 nm.

8. The transparent conductive film as claimed in claim 6, wherein a thickness of the third layer is about 60 nm to about 100 nm.

9. The transparent conductive film as claimed in claim 1, wherein the metal includes at least one of copper, silver, gold, aluminum, nickel, molybdenum, chromium, tantalum, and titanium.

10. The transparent conductive film as claimed in claim 1, wherein the metal oxide includes an ITO or an IZO.

11. The transparent conductive film as claimed in claim 1, wherein a resistance value of the transparent conductive film is equal to or less than about 50 Ω/sq.

12. An electronic device, comprising:
a first electrode;
a second electrode that overlaps the first electrode; and
an emission layer between the first electrode and the second electrode,
wherein at least one of the first electrode and the second electrode includes a transparent conductive film,
the transparent conductive film includes a metal oxide, a metal, and an epoxy, and
a refractive index of the metal is lower than that of the epoxy.

13. The electronic device as claimed in claim 12, wherein:
the first electrode is a reflecting electrode, and
the second electrode includes the transparent conductive film.

14. The electronic device as claimed in claim 12, wherein the emission layer includes a plurality of emission layers to emit white light when combined.

15. The electronic device as claimed in claim 14, further comprising a charge generation layer between the plurality of emission layers.

16. The electronic device as claimed in claim 12, wherein the transparent conductive film includes:
a first layer including the metal oxide,
a second layer on the first layer and includes the metal, and
a third layer on the second layer and includes the epoxy.

17. The electronic device as claimed in claim 16, wherein the second layer contacts the third layer.

18. The electronic device as claimed in claim 16, wherein the third layer has insulation characteristics.

19. The electronic device as claimed in claim 16, wherein the first layer, the second layer, and the third layer respectively include lateral walls that are parallel to each other.

20. The electronic device as claimed in claim 12, wherein the metal includes at least one of copper, silver, gold, aluminum, nickel, molybdenum, chromium, tantalum, and titanium.

21. The electronic device as claimed in claim 12, wherein the metal oxide includes an ITO or an IZO.

* * * * *